US009722165B2

(12) United States Patent
Carr

(10) Patent No.: US 9,722,165 B2
(45) Date of Patent: *Aug. 1, 2017

(54) THERMOELECTRIC PIXEL FOR TEMPERATURE SENSING, TEMPERATURE CONTROL AND THERMAL ENERGY HARVESTING

(71) Applicant: William N. Carr, Raleigh, NC (US)

(72) Inventor: William N. Carr, Raleigh, NC (US)

(*) Notice: Subject to any disclaimer, the term of this patent is extended or adjusted under 35 U.S.C. 154(b) by 0 days.

This patent is subject to a terminal disclaimer.

(21) Appl. No.: 15/083,286

(22) Filed: Mar. 29, 2016

(65) Prior Publication Data

US 2016/0240762 A1    Aug. 18, 2016

(51) Int. Cl.
*H01L 35/26* (2006.01)
*H01L 35/32* (2006.01)

(52) U.S. Cl.
CPC .............. *H01L 35/26* (2013.01); *H01L 35/32* (2013.01)

(58) Field of Classification Search
CPC .......... G01J 5/00; G01J 2005/007; G01J 5/12; H01L 35/28; H01L 35/32
USPC ................... 136/200–242; 250/338.1, 338.4; 257/E27.142, E27.143
See application file for complete search history.

(56) References Cited

U.S. PATENT DOCUMENTS

| | | | |
|---|---|---|---|
| 9,006,857 B1* | 4/2015 | Carr | H01L 27/14601 257/12 |
| 9,236,552 B2* | 1/2016 | Carr | G01J 5/14 |
| 2010/0031992 A1* | 2/2010 | Hsu | H01L 35/32 136/223 |
| 2010/0126548 A1* | 5/2010 | Jang | H01L 35/34 136/230 |

FOREIGN PATENT DOCUMENTS

JP    2003-344155    * 12/2003 ............... G01J 1/02

OTHER PUBLICATIONS

Boutchich et al., "Package-free infrared micro sensor using polysilicon thermopile", Sensor and Actuators A 121 (2005) 52-58.*

* cited by examiner

*Primary Examiner* — Thanh-Truc Trinh
(74) *Attorney, Agent, or Firm* — Kaplan Breyer Schwarz, LLP

(57) ABSTRACT

A thermoelectric pixel includes a micro-platform and a device layer having one or more support layers suspended at a perimeter thereof. The pixel includes structures which reduce thermal conductivity and improve platform planarity. In embodiments providing an infrared sensor, carbon nanotubes are used to enhance infrared absorption into the sensor pixel. In other embodiments, the pixel provides a thermoelectric energy harvester.

22 Claims, 16 Drawing Sheets

US 9,722,165 B2

THERMOELECTRIC PIXEL FOR TEMPERATURE SENSING, TEMPERATURE CONTROL AND THERMAL ENERGY HARVESTING

GOVERNMENT LICENSE RIGHTS

This invention was made with government support under W911NF13C0007 awarded by the U.S. Army Research Office. The government has certain rights in the invention.

STATEMENT OF RELATED CASES

This case is a continuation-in-part of U.S. Patent Application Serial No. 2016/0054179 filed Oct. 14, 2014. This case claims priority to U.S. Provisional Patent Application 62/282,558 filed Aug. 5, 2015. These cases are incorporated herein by reference.

If there are any contradictions or inconsistencies in language between this application and the cases that have been incorporated by reference that might affect the interpretation of the claims in this case, these related claims should be interpreted to be consistent with the language in this case.

FIELD OF THE INVENTION

The present invention pertains to a nanostructured thermoelectric pixel operated in either a Seebeck or a Peltier mode or both.

BACKGROUND OF THE INVENTION

The Seebeck and Peltier thermoelectric effects have been used in apparatus where the electric power levels range from femtoWatts to hundreds of Watts. A thermoelectric device operating in the Seebeck mode converts a temperature differential into an electric voltage. A thermoelectric device operating in the Peltier mode converts electric power into a refrigerative cooling.

The pixel of this invention is comprised of nano- and micro-dimensioned thermoelectric structures. In embodiment apparatus the pixel is operated in the Seebeck mode. In some embodiments the pixel is adapted to function as an infrared thermopile for remote temperature sensing and spectrometry. In other embodiments the pixel functions as an energy harvester transducing heat into electrical energy. In energy harvesting embodiments the pixel provides power to operate low-power electrical circuits and sensors. The pixel operating in the Seebeck mode in embodiments powers The pixel operated in the Peltier mode is adapted to cool circuit components including sensors low thermal power levels. It is desirable in applications to cool these circuit components such as low noise amplifiers in order to provide an operational environment at a lower temperature.

Any thermoelectric device can be operated in either the Seebeck or Peltier mode. This is possible because the Seebeck and Peltier thermoelectric effects are thermodynamically reversible effects.

SUMMARY OF THE INVENTION

It is an object of the present invention to provide a thermoelectric pixel incorporated into embodiments configured variously as a Seebeck sensor, Peltier cooler, and Seebeck thermal energy harvester. The thermoelectric pixel can be configured singly or into an array structure. In embodiments the pixel provides a sensor for long-wave and ultra-long wave infrared incident radiation. In embodiments the present invention provides a pixel that can control the temperature of a micro-platform with integrated circuits and sensors disposed on or therein. In embodiments of the present invention a micro-platform can be both cooled with Peltier thermoelectric devices and resistively heated providing a temperature-controlled micro-environment for circuits, sensors and chemical/biological reactions. In embodiments the pixel can harvest thermoelectric power from two isothermal surfaces maintained at a temperature differential and provide power to operate electronic circuits and sensors.

The present invention provides a thermoelectric apparatus having embodiments that include remote sensing, temperature control and energy harvesting capabilities. In some embodiments, the thermoelectric pixel includes:
 a micro-platform, (i.e. a platform having micron dimensions ranging typically 1 to 2000 microns;
 a support layer comprised of a stress-enhancing film disposed to provide a tensile stress across the micro-platform
 a plurality of thermoelectric devices wherein a first junction of each thermoelectric device is disposed in or on the micro-platform and a second junction of each thermoelectric device disposed in or on the off-platform region;
 a plurality of nanowires connecting the first and second junctions nanowires structured with a physical adaptation that enhances scattering and/or resonance of phonons for the purpose of reducing thermal conductivity;
 a semiconductor device, such as an electronic device, an opto-electronic device, a thermal energy harvester, an infrared imager, etc.

In some embodiments operated in the Seebeck thermovoltaic mode, a temperature differential is maintained across the pixel with respective thermal paths to two isothermal surfaces. It is the temperature differential across the thermoelectric device which produces a voltage at the output terminals of the thermoelectric pixel. The thermoelectric structures operating in a Seebeck mode generate a voltage proportional to the temperature difference between the junction on the micro-platform and the junction that is off-platform. The junction that is located off-platform provides a reference temperature as well as a means for electrical connection to off-platform circuits. The output voltage is used to provide electric power in known fashion into associated circuits.

In some embodiments operated in the Peltier mode, a voltage provided from an external power source results in a refrigerated cooling of the micro-platform. To do this, an electric current is passed in the appropriate direction through a thermoelectric device causing both types of charge carriers to move away from the junction and convey heat away, thus cooling the junction. This feature can be used for example and without limitation, to: (1) reduce the electrical thermal noise inherent in the output signal from an integrated circuit, (2) provide a means of temperature control for sensor structures including an infrared thermopile, and (3) provide a means of dynamic, real-time control of the micro-platform temperature with closed-loop circuit control for applications such as micro-chemical reactors.

In this invention the thermoelectric devices are comprised of nanowires of various materials and configurations. An important aspect of many embodiments of the present invention is to provide a reduced thermal conductivity across the interface structures between the micro-platform and the adjacent off-platform area. This is obtained in the present invention with a physical adaptation that enhances scattering or resonant dissipation of phonon transport through nanowires of the thermoelectric device. In this invention nanowire materials are selected where the scattering length for heat-conducting phonons is much greater than for electrical-conducting electrons. This invention takes advantage of the difference in scattering lengths for phonons versus electrons. In this invention scattering structures are typically created in nanowires using a lithographic or direct electron beam patterning. In some embodiments the physical adaptation includes micro-cavities. In some embodiments the physical adaptation includes structures of dimensions and separations less than the scattering length of heat conducting phonons. In some embodiments the physical adaptation includes scattering structures comprised of structural particulates. In some embodiments a phonon resonance is obtained with structuring at dimensions approaching the phonon wavelength which results in a decreased thermal conductivity In some embodiments the physical adaption in the nanowires includes programming the electrochemical deposition or multisource evaporation process for film deposition to provide a porous or particulate-structured film with built-in phonon scattering structures. In other embodiments the physical adaption includes programmed growth of nanotubes into nanowires with enhanced phonon scattering. In all embodiments the thermal conductivity of the nanowire is advantageously reduced by the physical adaptation with a limited effect on the electrical conductivity.

In embodiments the nanowires are fabricated from the device layer of a starting silicon or silicon-germanium SOI wafer. In other embodiments the nanowires are comprised of film materials deposited by various processes and patterned with a nano-scale dimension. The nanowires are comprised of one or more materials including without limitation silicon, silicon-germanium, bismuth telluride, lead telluride, germanium, indium gallium arsenide, bismuth, silver and nanotubes configured into crystals/polycrystals/alloys/composites/particles thereof.

In silicon nanowire embodiments, the phonon scattering length (ranging from about 50 nanometers upward) is typically more than 10× greater than the scattering length for electrical charge carriers (about 5 to 50 nanometers). Typically, the physical adaptation in nanowires affecting phonon transport has longitudinal dimensions greater than the scattering length of charge carrier transport (electrons and holes).

The micro-platform and thermoelectric devices have one or more support layers suspended at a perimeter thereof. Support layers are preferably comprised of a material of low thermal conductivity and high bulk modulus such as silicon dioxide, silicon nitride, silicon oxynitride, gallium nitride, and silicon carbide. In the present invention one or more of the support layers is created with an intrinsic tensile stress which provides a biaxial tensile stress peripherally to the suspended micro-platform and thermoelectric devices. The resulting biaxial tensile stress across the micro-platform reduces buckling, wrinkling, and localized cracking and makes the micro-platform more robust and tolerant to mechanical and thermal stressing. Prior thermoelectric pixel art does not teach the use a stress-enhancing film disposed to provide a tensile stress across the thermoelectric micro-platform.

Single thermoelectric devices do not provide an adequate response for embodiment applications of this invention. As a consequence, a plurality of series-connected thermoelectric elements are used. In some Seebeck embodiments the pixel is configured to provide a maximum Volts/Watt response to absorbed incident long wave and ultra-long wave infrared radiation. In embodiments the pixel is adapted with one or more infrared absorbers disposed in or on the micro-platform. The absorbers are selected for wavelength-selectivity, absorption efficiency and other factors. These absorbers comprise one or more of carbon nanotubes, nano-sized particulates, silicon grass, nanotubes of non-carbon material, lithographically-patterned structures and plasmonic metamaterial structures.

In some Seebeck embodiments where the pixel is disposed within a thermal path between two isothermal surfaces, the number of series-connected thermocouples is increased to over 500. In embodiments the pixel may be disposed in arrays with the thermoelectric devices all electrically-connected in series. In embodiments a large number of series-connected thermoelectric elements provides a voltage level to power CMOS ultra low power transistors and integrated circuits without any intermediate DC-to-DC voltage step-up circuits. In some Seebeck and Peltier embodiments the pixel is configured to provide an electrical impedance match for maximum power transfer efficiency with a respective external load element or external power source In the illustrative embodiment the pixel is comprised of a micro-platform and a first device layer have one or more support layers suspended at a perimeter thereof. At least one support layer is comprised of a stress-enhancing film disposed to provide a tensile stress across the micro-platform.

In the illustrative embodiment the pixel is formed as follows. In this illustrative embodiment the starting wafer is silicon sandwich configured as a semiconductor-on-insulator, "SOI" wafer. A starting micro-machinable wafer comprised of a first device layer film of appropriate conductivities, a sandwiched silicon dioxide film of low electrical and thermal conductivity and an underlying silicon handle substrate is prepared. The sandwiched film typically has a thickness of 0.3 to 3 microns. The sandwiched oxide film provides a layer underlying the micro-platform which may be removed by a sacrificial etch as appropriate. An SOI starting wafer is typically prepared by processes including BESOI and SMARTCUT™ well known to those familiar with the art. The surface film in the illustrative embodiment is next patterned lithographically to define the micro-platform and nanowires. In other embodiments an additional device layer of non-silicon material such as bismuth telluride is deposited and patterned to form nanowires. In these embodiments the nanowires are comprised of non-silicon instead of silicon formed from the active layer of the starting wafer.

For the illustrative embodiment a first support layer of typically silicon nitride is next deposited and patterned to provide a biaxial tensile stress to the nanowire and micro-platform.

One or more cavities are then formed in one or more underside regions below the micro-platform using a backside etch or a front-side sacrificial oxide etch. Among any other purposes, this arrangement substantially thermally isolates the one or more micro-platforms from the surrounding ("off-platform") regions. When the buried silicon "BoX" layer is not removed it provides a second support layer. A cavity under each micro-platform and in some embodiments extending under the nanowire device layer is created using a selective etch optimized for micromachining. Each such cavity thereby thermally isolates the microplatform and in embodiments also thermally isolates the nanowires.

The micro-platform formed by patterning the active layer has dimensions ranging typically from about 1 to 2000 microns on a side. The first support layer, which in the illustrative embodiment is silicon nitride, has a thickness that is typically in the range of about 0.1 to 3 microns. In other embodiments the starting wafer is a bonded sandwich wafer with a non-silicon active layer such as silicon-germanium.

In the illustrative embodiment, the device layer comprises degenerate single-crystal silicon which has both a high electrical and thermal conductivity. The high thermal conductivity of silicon provides an isothermal micro-platform. In some Seebeck embodiments infrared absorbing structures are disposed on the micro-platform to enhance absorption of incident radiation.

In some embodiments, structures such as integrated signal conditioning circuits are created in or disposed on the micro-platform to reduce parasitic noise and to potentially reduce cost of manufacture.

In embodiments additional thin films of nanometer thickness may be deposited for the purpose of enabling lithographic patterning or sacrificial etching.

Figures of merit for a Seebeck pixel include responsivity expressed in Volts/absorbed Watt or Volts/deg C. One figure of merit for a Peltier pixel is its responsivity expressed in cooling Watts/supplied electrical Watt. These figures of merit are determined by the structural and material parameters of the pixel.

Another performance metric especially in some Seebeck embodiments is that the micro-platform must behave as if it is isothermal and the overall thermal time constant, $t_p$, of the thermoelectric devices coupled with the micro-platform must be sufficiently small. The temporal sampling interval, $t_s$, for readout of excitation of structures on the micro-platform must be less than the thermal time constant $t_p$.

$$t_p = c/\sigma$$

wherein: c is the thermal heat capacity of the micro-platform and $\sigma$ is the thermal conductance between the micro-platform and the off-platform area. The thermal time constant $t_p$ in specific embodiments is controlled by the structural dimensioning and material types forming the pixel.

To package the pixel which is typically manufactured at a wafer scale, dicing techniques are used which do not damage the thin platform area, as known to those skilled in the art. For example, dicing can be performed using a $CO_2$ laser scriber tool. In packaging, the resulting die are next bonded to the lead frame of an appropriate header, followed by ultrasonic wire bonding. The header is a selected material such as alumina, epoxy, or FR4 printed circuit board.

The next manufacturing steps involving the pixel depend on the specific embodiment apparatus. In some embodiments functioning as an infrared sensor, a cap for the header is bonded with an appropriate metal or epoxy film. The cap is comprised of infrared-transparent material such as crystalline Ge, Si or KBr and is sometimes structured as an infrared lens.

In some embodiments the micro-platform of the pixel may contain integrated circuits and sensors which have been created with separate front-end processing prior to final wafer-level micromachining such as a CMOS low-noise amplifer and microcontrol circuit.

In some embodiments, the micro-platform and thermoelectric devices are hermetically packaged. This permits introduction of an internal gas of low thermal conductivity which reduces parasitic heat transfer between the micro-platform and the off-platform area. Typical gas species of low thermal conductivity include krypton, xenon and argon. A hermetic seal is also used in embodiments where the micro-platform is disposed in a vacuum.

For some Seebeck thermal energy harvesting embodiments the semiconductor pixel is mounted between a topside and a bottomside thermally conducting sheets of material such as aluminum or copper foil which provide two isothermal surfaces. For operation the resulting thermoelectric generator is disposed in an environment which maintains a temperature differential between the two thermally conducting sheets. In these embodiments the pixel is typically disposed within a laterally-surrounding low thermal conductivity material such as a polyurethane foam or aerogel of sufficient rigidity. This permits incorporating the pixel into apparatus embodiments such as passive transponders with sensors. Other configurations include a wearable wristband, chestband, or adhesive skin patch for biosensing applications In some thermal energy harvesting embodiments, the pixel is bonded into a stacked-structure providing a thermal path between isothermal surfaces of different temperature through the pixel nanowires. This pixel bonding is in some instances accomplished at wafer-scale.

In some thermal energy harvesting embodiments, the pixel is adapted by the addition of integrated circuits assembled on a printed circuit board to function as an electronic sensor for temperature, humidity, sweat, pressure, strain, acceleration, fluid flow, velocity, nuclear radiation, gravitational force, light intensity, infrared radiation, nuclear radiation, chemical species and electromagnetic radiation of various wavelengths. Electronic ancillary components in embodiments may include variously a supercapacitor and a DC-to-DC voltage converter.

In some embodiments the pixel is adapted by the addition of a radio and antenna to function as an RFID transponder wherein the thermoelectric pixel is operated in the Seebeck mode to power the transponder. These embodiments typically are configured with two isothermal plates positioned to provide an environmental temperature gradient. In some embodiments the two isothermal plates provide a dual function as RF antennas. The RF antenna/isothermal surfaces may be one of a generic family of patch antennas or ribbon single/dual cavity antennas. These antennas are designed into many subtypes by those familiar with the art including basic dipoles, folded dipoles, half-dipoles with and without integral inductors and capacitors. The typical antenna structure often has at least one dimension in the range of a quarter or half wavelength corresponding to one or more of the RF frequencies of interest. In other embodiments the antenna dimensions may be reduced to a small fraction of a wavelength of the desired radio communication to provide a greatly reduced footprint for the apparatus. This dual integration of isothermal surfaces and RF antenna elements provides important advantages for size reduction, reduced cost and improved performance. In embodiments the apparatus is comprised of a radio with an integral antenna providing wireless communication with a remote interrogator or wireless network.

In some embodiments the apparatus is comprised of an ancillary support energy source including such as one or more of a battery, solar cell, piezoelectric generator, fuel cell, or microelectromechanical power source.

DETAILED DESCRIPTION

Definitions

Figure 1A:
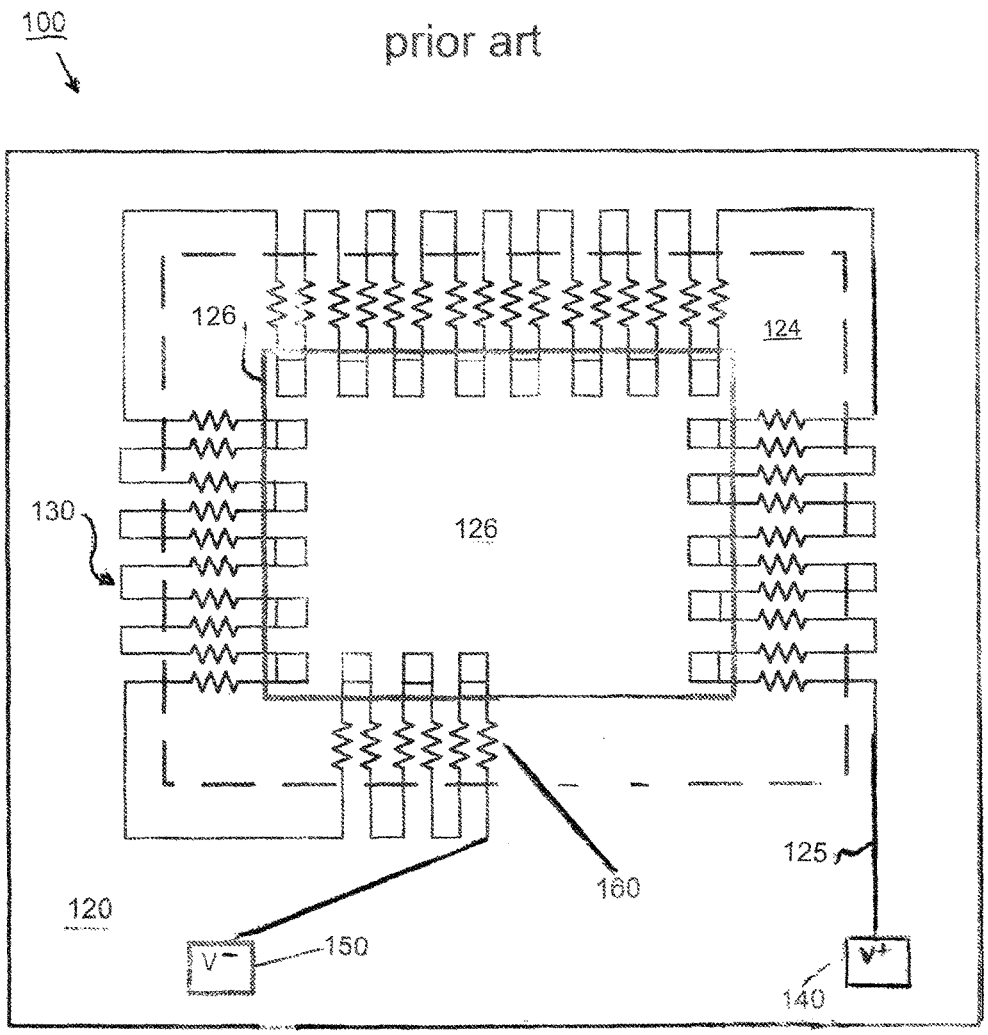
FIG. 1A depicts a plan view of prior art pixel structure.

The following terms are explicitly defined for use in this disclosure and the appended claims:

"Seebeck effect" means the direct conversion of a temperature difference across a thermoelectric device to a voltage.

"Peltier effect" means the direct conversion of electrical energy supplied to a thermoelectric device to extract heat from a micro-platform.

"thermoelectric apparatus' means an apparatus comprised of one or more "thermoelectric pixels".

"thermoelectric pixel" refers to a pixel comprised of a micro-platform and a plurality of thermoelectric devices.

"micro-platform" refers to the isothermal structure within a thermoelectric pixel in thermal contact with the thermoelectric devices.

"thermoelectric device" in this invention refers to a series connection of devices operated as Seebeck voltage sources or Peltier cooling sinks.

"thermoelectric element" refers to an element such as a nanowire within a thermoelectric device "nanowire" refers to an electrically conductive thermoelectric element within a thermoelectric device.

"radio" refers to a communication device which can be passive, semi-passive or active.

"passive transponder" refers to a radio device powered only by energy harvested from incident radiation.

"semi-passive transponder" refers to a radio device wherein communication to a remote interrogator is implemented by controlled backscatter-modulation of incident radiation.

"active transponder" refers to a radio fully- or partially-powered by an internal energy source such as an electric battery.

"RFID" refers to a two-way wireless communications protocol.

"patch antenna" refers to an RF antenna with a driven topside patch typically a flat conductor patterned or unpatterned. A patch antenna is driven using an RF source connected between the radiating patch and an underlying bottomside ground plane.

"dipole antenna" refers to an antenna with connections to an RF radio whereby the connections are located within the plane or planes of the radiating elements of the antenna.

"semiconductor-on-insulator" refers the starting wafers used in the illustrative embodiment. This type of wafer is typically comprised of three layers including an "active" layer, a "buried oxide layer" ("BoX") layer and a thicker "handle' layer. The most common semiconductor-on-insulator wafer has traditionally included a silicon device layer, a silicon dioxide box layer, and a silicon handle. This wafer is usually referred to as an "SOI" wafer. Semiconductor sandwich wafers comprising a silicon-germanium alloy/silicon oxide/silicon handle sandwich and other combinations including various semiconductors and dielectric films are used in other embodiments.

"nano-cavity" refers a hole or local structural discontinuity in the physical structure of a nanowire.

"micro-platform supported by" refers to, for example, a layer supported by, but not necessarily disposed on or under, another layer. For example, in this invention a support layer can be disposed to support the micro-platform through connecting structural nanowires.

Figure 1B:
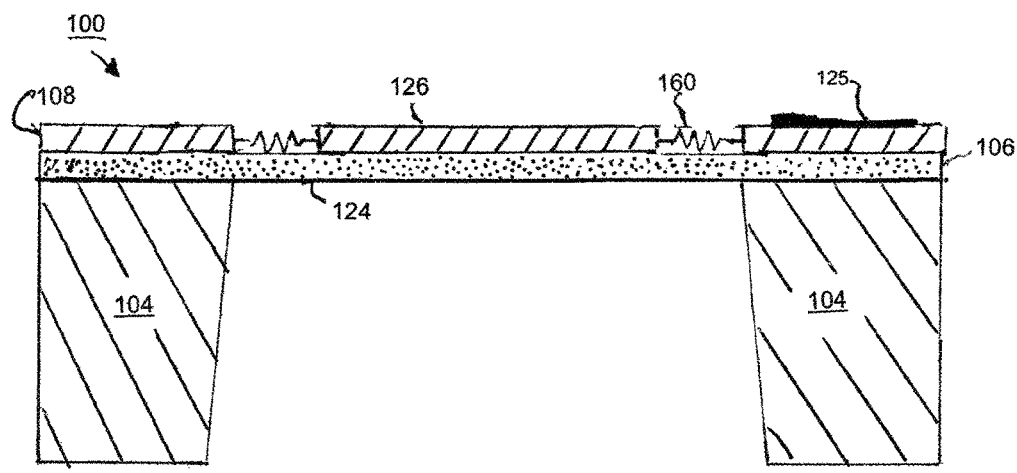
FIG. 1B depicts a cross-sectional view prior art pixel structure.

FIGS. 1A and 1B depict respective plan and cross-sectional views of a prior art thermoelectric micro-platform 100 related to the present invention. Thermoelectric micro-platform 100 comprises off-platform region 120, micro-platform 126, thermoelectric device 130, nanowire 160 and support layer 124. The support layer is part layer 106 is sandwiched between the device layer 108 and the substrate 104. The micro-platform 126 and nanowires 160 are typically lithographically patterned from the device layer 108. A plurality of thermoelectric devices 130 is electrically-connected in series through interconnects 125 to terminals 140 and 150. The terminals are connected to load circuits or power supply circuits in order to achieve respective functions in the Seebeck or Peltier mode. This prior art is referenced in U.S. Pat. Nos. 9,006,857 and 9,236,552 and is incorporated herein by reference. Prior thermoelectric pixel art does not teach the use a stress-enhancing film disposed to provide a tensile stress across the thermoelectric micro-platform.

Figure 2A:
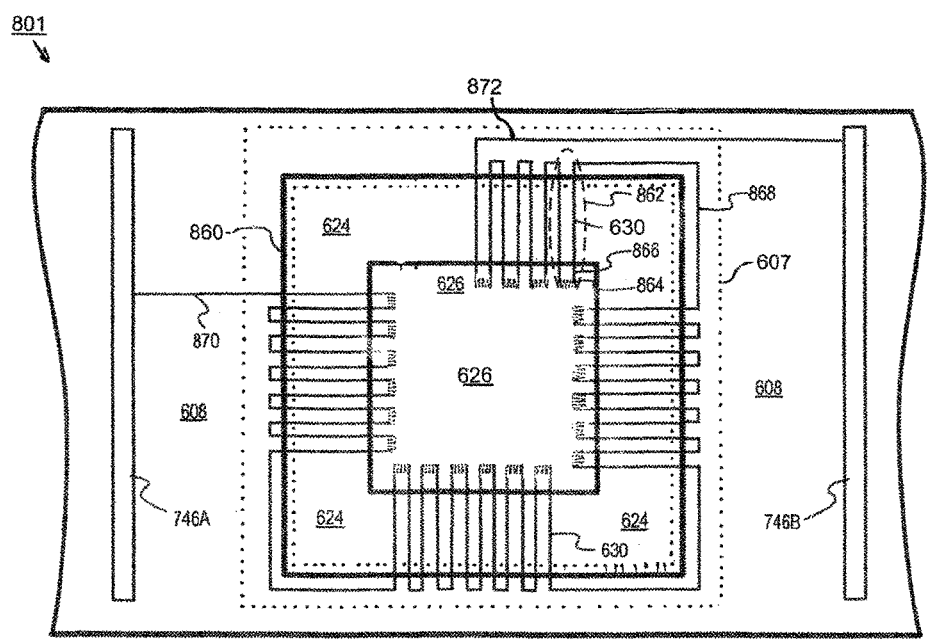
FIGS. 2A, 2B, 2C and 2D depict cross-sectional views of pixel structures in accordance with the illustrative embodiments of the present invention.

The present invention pixel 801 is depicted in FIGS. 2A, 2B, 2C and 2D. These FIGS depict a plan view followed by three cross-sectional views of pixel structures in accordance with the illustrative embodiment of the present invention. Referring to FIG. 2A of the illustrative embodiment, thermoelectric device 868 comprised of nanowires 630 provides the thermal connection path between micro-platform 626 and off-platform area 608. Each thermoelectric device 868 is comprised of two nanowires 630. The thermoelectric devices are connected electrically in series via wires 872 into two terminals 746A and 746B. An overlying film 607 provides a first support layer and tensile stress through the length of the suspended nanowires 630 and across the micro-platform 626.

Figure 2B:
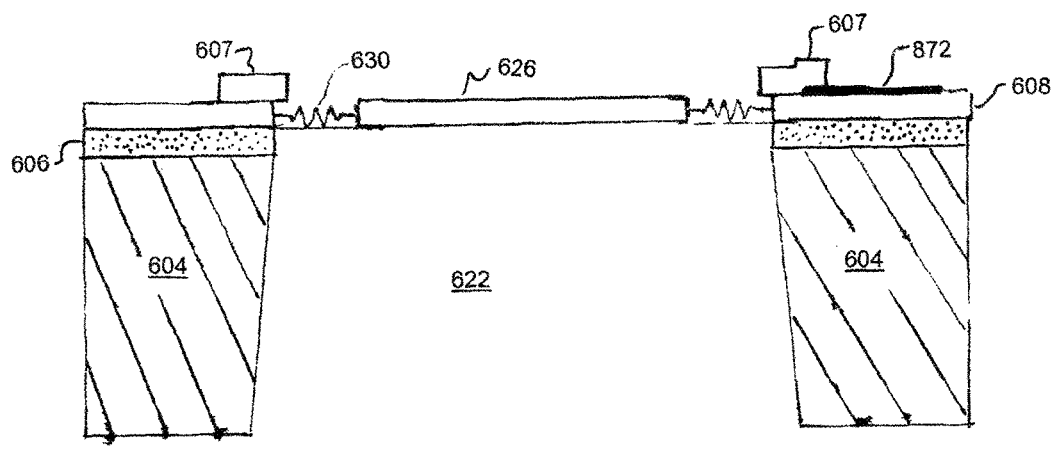
Figure 2C:
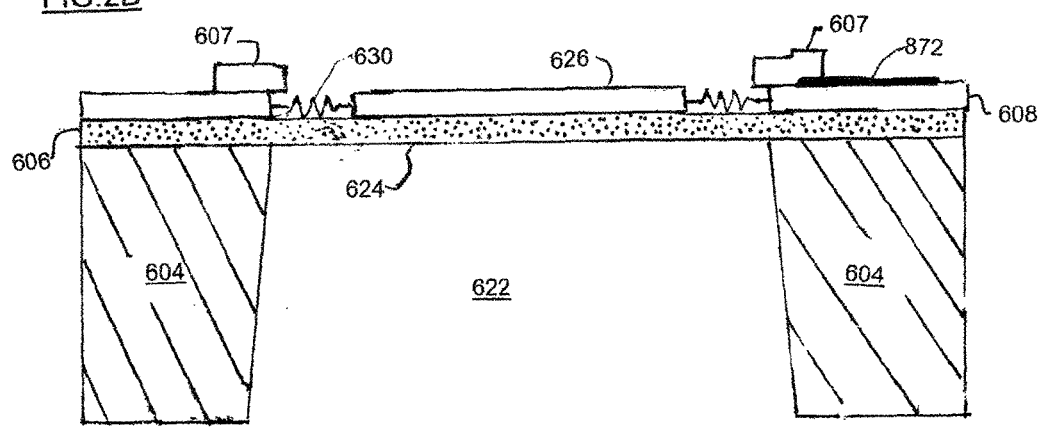
Figure 2D:
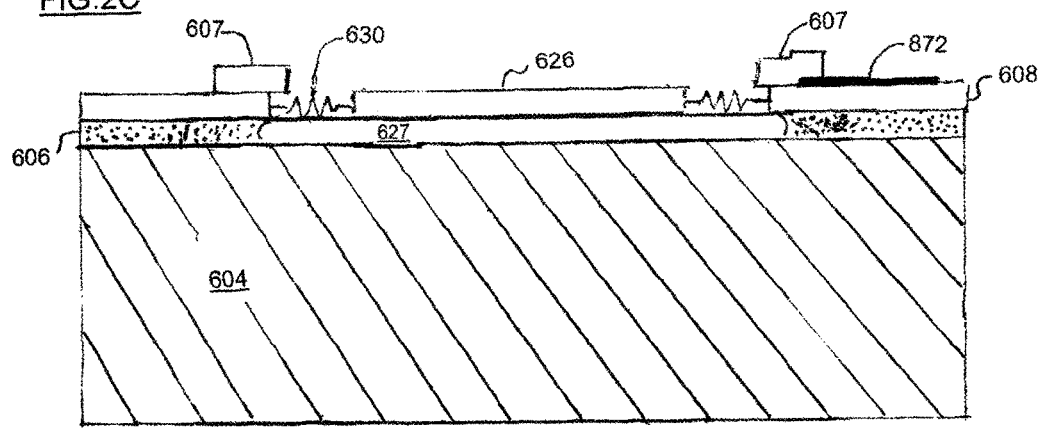

The feature 624 comprises different structuring in FIGS. 2B, 2C and 2D. Referring to FIG. 2A the feature 624 is the cavity 622 in FIG. 2B and cavity 627 in FIG. 2D. The feature 624 is the portion of the layer 606 in FIG. 2C providing a second support layer. In FIG. 2D the cavity 627 extends under the micro-platform 626 and in instances also the nanowire 630.

The layer 606, typically of thickness 0.1 to 3 microns, which in an embodiment is silicon dioxide with thermal conductivity 1.5 W/mK.

In a manufacturing process the micro-platform 626 is formed from the "active" layer of an SOI wafer. Well known to those skilled in the art, an SOI wafer comprises three layers: (i) an uppermost layer of single crystal silicon which is called the "active" layer, (ii) a lowermost substrate or "handle" wafer of single crystal silicon, and (iii) a layer of silicon dioxide sandwiched between the aforementioned layers. In illustrative embodiments of FIGS. 2B and 2C the buried layer or "BOX" layer 606 remains underneath the micro-platform 626 thereby providing a second support structure for the micro-platform. In the illustrative embodiment of FIG. 2D the BOX layer of the SOI wafer is not used to support the micro-platform.

Micro-platform 626 and off-platform 608 areas are defined from the starting wafer using a lithography tool. The nanowires 630 are formed from a first device layer which in one embodiment is the same "active" layer used to define the micro-platform. In other embodiments the nanowires 630 are formed of a thermoelectric material different from the micro-platform. Nanowires 630 may be formed from films such as but not limited to silicon, silicon-germanium, bismuth telluride, lead telluride, germanium, indium gallium arsenide, bismuth, silver and nanotubes including alloys/composites/particles thereof. In embodiments the nanowires may be defined from film layers using PECVD, LPCVD, sputtering, evaporation, sol-gel, electrochemical and laser ablation deposition techniques and subsequent patterning familiar to those skilled in the art.

Nanowires which connect junctions disposed in or on the micro-platform 626 and off-platform 608 areas can be formed, for example, by patterning the active layer of a starting SOI wafer (e.g. single-crystal silicon) or by depositing and patterning non-silicon layer or layers. Non-silicon materials include without limitation silicon-germanium, bismuth telluride, lead telluride, PZT, germanium, indium gallium arsenide, bismuth, silver and nanotubes including alloys/composites/particles thereof.

An important aspect of many embodiments of the present invention is to provide a reduced thermal conductivity across the interface structures between the micro-platform 626 and the adjacent off-platform area 608. This is obtained in the present invention with a physical adaptation that enhances scattering or resonant dissipation of phonon transport through the thermoelectric device wires 630. In this invention nanowire materials have a scattering length for heat-conducting phonons which is much greater than for electrical-conduction electrons. This invention takes advantage of the difference in scattering lengths for phonons versus electrons. In this invention scattering structures are typically created in nanowires 630 using a lithographic or direct electron beam patterning with critical dimensions as small as 10 nm. These structures are physical adaptations that in embodiments require deep-submicron lithography tools such as deep-submicron steppers or electron beam scanners with a specialized photoresist typically a form of PMMA.

In some embodiments the physical adaptation comprises a multiplicity of holes or micro-cavities in a nanowire 630. In some embodiments the physical adaptation includes scattering structures comprised of structural particulates. In some embodiments a phonon resonance is obtained with structuring at dimensions approaching the phonon wavelength which results in a decreased thermal conductivity. In all embodiments the physical adaptation reduces the thermal conductivity of the nanowire 630 with a limited effect on the electrical conductivity.

The nanowires 630 in all embodiments are supported by a first support layer 607. In some embodiments the nanowires and micro-platform are additionally supported by a second support layer 606.

In a typical manufacturing process creating the pixel 801, the first support layer 607 is deposited and patterned following creation of the micro-platform 626 and nanowires 630. In some embodiments the first support layer 607 extends over the nanowires 630 onto the micro-platform 626. In all embodiments this layer is created with a built-in tensile stress which provides a biaxial tensile stress across the micro-platform 626. This biaxial stress reduces buckling and cracking of the micro-platform 626.

Among any other purposes, this pixel 801 arrangement substantially thermally isolates the one or more micro-platforms 626 from the surrounding ("off-platform") region 608 and provides a means of concentrating tensile stress onto the micro-platform 626.

If the starting wafer is other than SOI, such as an oxidized silicon wafer, then a layer of semiconductor is deposited on the oxide layer. The semiconductor active layer will be patterned to define the micro-platform 626. In some embodiments this same layer is used to define the nanowires 630.

If the active layer in the starting wafer is already doped to a desired p- or n-doping level, then a compensating donor or acceptor impurity is used to achieve the desired impurity polarities and densities for the thermoelectric devices and other structures. Patterned doping is achieved typically using spin-on-dopants "SOD" and patterning is obtained with a lithographic stepper or e-beam lithography tool. Those skilled in the art are familiar with such doping operations including appropriate dopant atoms, doping levels and methods for doping.

At an appropriate time, typically after the first support layer is created, custom structures unique to embodiments are created. These structures include creating infrared absorbing structures 609 in or on the micro-platform 626. These structures include creation of integrated circuits and integrated components in or on the micro-platform 626 and also in or on the off-platform area 608 of a pixel 801.

Interconnects 870, 872, 746A and 746B are formed in a standard manner typically of a metal aluminum film deposited and patterned usually by conventional metal lift-off processing with a photoresist. In embodiments appropriate interconnections between pixels and between integrated circuits are created as appropriate.

Cavities 622 and 627 under the micro-platform are created near the end of the pixel manufacturing process. This is because the micro-platform 626 and nanowires 630 are fragile and is often damaged with typical wafer handling.

In the embodiments of FIGS. 2B and 2C cavity 622 is formed in regions underlying the micro-platform 626. These regions are formed using a backside through-wafer etch. The back-side etch is performed to create cavity 622 beneath the region designated to be micro-platform 626. The etch proceeds through substrate layer 604 to an etch stop at layer 606, which will become a second support layer of the micro-platform. In the case of an SOI starting wafer, the etch proceeds through the substrate 604 to the silicon dioxide layer. This effectively "releases" micro-platform 626 and thermally isolates the the micro-platform 626 from the "off platform" area 608.

The back-side etch can be performed via deep-reactive ion etching ("DRIE"), configured, for example, to achieve near vertical sidewalls of the cavity (e.g. via the Bosch process, etc). Alternatively, the backside etch can be performed using wet chemical etchants, such as, without limitation, TMAH and potassium hydroxide.

In the embodiment of FIG. 2D a cavity 627 is formed in the layer 606 which achieves the same thermal isolation as is provided by the backside cavity 622. In embodiments cavity 627 is created using a topside etch. In the case of a silicon dioxide layer 606 the etchant is typically a hot HF aerosol. The aerosol etch with SOI wafers reaches the oxide layer 627 directly through patterned holes in the micro-platform 626. The topside aerosol etch is selective against silicon and the material used for the nanowires.

The pixel 801 is processed in a semiconductor foundry cleanroom using processing generally compatible with production of silicon integrated circuits including CMOS.

In all embodiment functions we desire to maintain the temperature of the micro-platform at a different temperature from the off-platform area by operating the pixel in either a Seebeck or Peltier mode.

EXAMPLE 1

Infrared Detector Pixel

Figure 3:
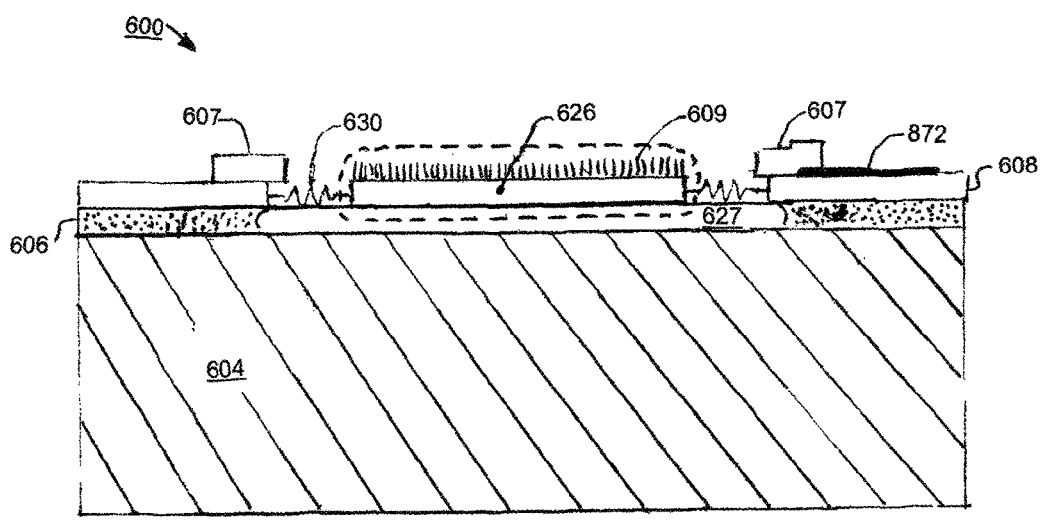
FIG. 3 depicts a simplified plan view and cross-sectional view of the pixel configured as a detector for long wave infrared radiation in accordance with an embodiment of the present invention.

The pixel 801 can be physically adapted as depicted in FIG. 3 to provide an infrared detector pixel 600 by providing structures 609 that absorb incident radiation in or on the micro-platform 626. Infrared absorbing structures that can be disposed on the micro-platform 636 include:

- Vertical wall carbon nanotubes grown by standard methods. Nanotubes can be grown in reactors at temperatures over 500 deg C. using acetylene gas as a precursor. Nanotube growth is obtained selectively on the micro-platform 626 using patterned catalytic films such as a composite iron-ALD/alumina film of a few nanometers thickness. Nanotubes of other materials can also be grown.
- Silicon grass grown using deep reactive ion etching (DRIE).
- A film comprised of a silicate matrix or other dielectric matrix, which can be deposited via a sol-gel process.
- Nanometer-dimensioned particulates comprising "coin" metals (e.g. Ni, Au, Ag, Cu, etc) are embedded in the film.
- A matrix of particulates containing carbon black.
- A high density of lithographically-patterned, nano-dimensioned pedestals to comprise a metamaterial absorber.

Nano-dimensioned particulates in the form of nano-dimensioned discs, cubes, spheres, or literally any shape (including non-regular). These particulates provide a combination of absorption mechanisms, such as scattering with light trapping as plasmons. For coin-metal nano-dimensioned particulates that touch the semiconducting micro-platform 626, another infrared absorption mechanism exists. The particulates are formed into Schottky diodes with a eutectic rapid thermal anneal RTA process. These Schottky diodes extract energy from the surface plasmons and also directly via a classical electromagnetic "radar cross section", thereby dissipating energy into the micro-platform 626 as desired.

Figure 4:
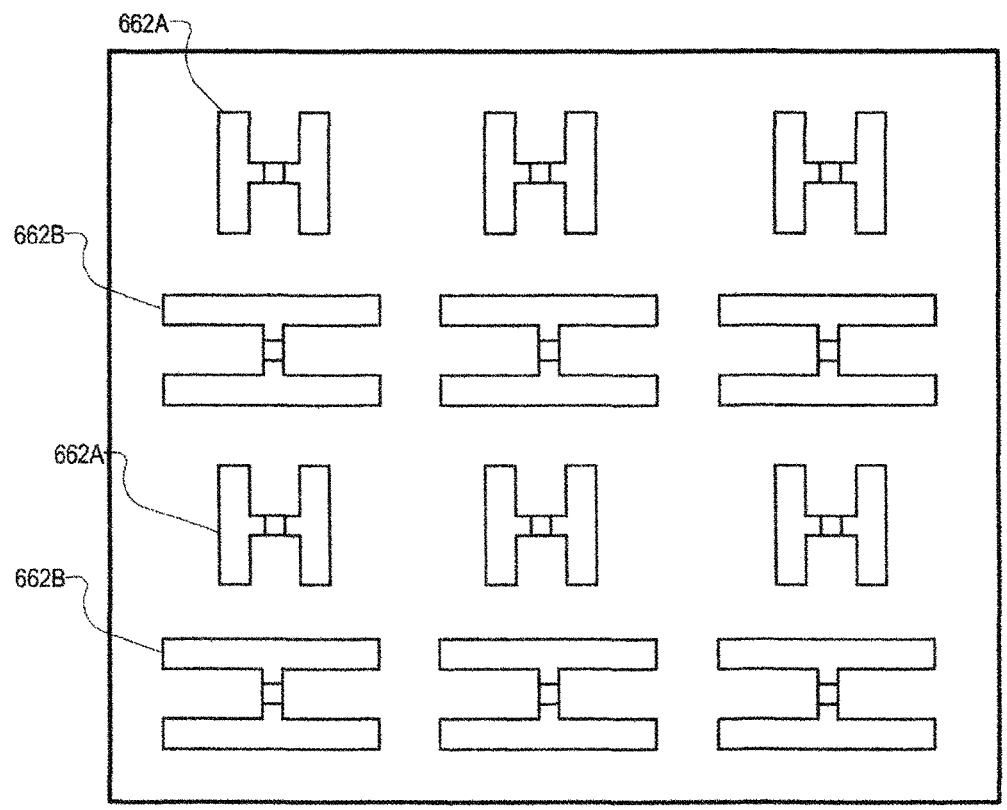
FIG. 4 depicts a plan view of the pixel micro-platform structured with a micro-dipole antenna embodiment configured as a detector for ultra-long wave infrared radiation in accordance with the present teachings.

In another embodiment, the pixel 801 can be physically adapted as depicted in FIG. 4 to provide an infrared detector with enhanced sensitivity absorbing ultra long wavelength infrared by patterning the micro-platform 626 further into a structure 662A. FIG. 4 depicts a plan view of the micro-platform 626, adapted to include an array of antennas, including two rows of directional half-wavelength dipole antennas 662A and two rows of directional half-wavelength dipole antennas 662B. Each antenna is resonant at one or more infrared frequency bands. Antennas 662A are resonant at a different one or more infrared frequency bands than antennas 662B. Also, antennas 662A and 662B are sensitive to different polarizations (i.e. vertical and transverse). This embodiment with antennas provides infrared sensitivity over a range 2 to 200 microns wavelength. The antennas are diffused into, implanted into, or formed on the micro-platform 626 in known fashion. In this embodiment the active layer of the starting wafer is single crystal silicon or silicon-germanium of maximum electrical resistivity.

In all embodiments (i.e. FIGS. 3 and 4) the antennas have nanometer-scale dimensions and, when formed in a surface such as micro-platform 626 will enhance the creation of surface plasmons. This provides local trapping of incident infrared and, hence, causes further heating of the device layer 626 to enhance detector response. Thus, the embedded nanoscale antennas used in conjunction with embodiments of the invention have different characteristics as compared with antenna behavior in free space.

In yet another embodiment, the antennas may be disposed into a multiplicity of micro-platforms spaced to interact electromagnetically. This is achieved by disposing antennas on cavities that are laterally-spaced typically with half- or full-wavelength separations. Antennas spaced in this manner can provide a form of a "resonant array" and provide a an increase in infrared sensitivity or improved radiation directivity.

The pixel 801 configured for infrared detection provides an active signal source of voltage into readout circuitry. In embodiments the pixel 801 can be disposed into arrays of size ranging up to over a million pixels. In embodiments the pixel 801 provides an infrared detector with application similar to the bolometer which is typically comprised of an array of thermisters or semiconductor photodiodes.

EXAMPLE 2

Thermoelectric Microcooler

The pixel 801 of the illustrative embodiments of FIG. 2 can function as a thermoelectric microcooler (Peltier mode) by passing an electric current in the appropriate direction through the thermoelectric element 862 causing both types of charge carriers to move away from the junction and convey heat away, thus cooling the junction. This feature can be used, for example, and without limitation, to: (1) reduce the electrical thermal noise inherent in the output signal of an integrated circuit, (2) provide a means of temperature control for sensor structures including an infrared detector, and (3) provide a means of dynamic real-time control of the micro-platform temperature of items and circuits of interest disposed on the micro-platform 626.

In this embodiment the pixel 801 in FIG. 2 is operated in the Peltier cooling mode. In the Peltier embodiment (1) keeping the micro-platform 626 (with an integrated circuit disposed thereon) cool reduces the electrical thermal noise inherent in the output signal from the integrated circuit. In embodiments with circuits disposed on or in the micro-platform, electrical connection to the circuits is obtained through dedicated nanowires interfacing to additional off-pixel circuits. In the Peltier embodiment (2) precise temperature control of the micro-platform 626 permits a precise temperature environment for monitoring chemical, biological, physical reactions and effects. As an example, precise temperature control of the micro-platform 626 permits slowing down chemical and bacterial/viral reactions with cooler temperature in order to determine temporal reaction and interaction rates. When the supply voltage polarity driving the Peltier array is reversed, the micro-platform 626 is heated, thus providing an extended range of temperature control.

EXAMPLE 3

Remote-Sensing Infrared Thermometer

Figure 5:
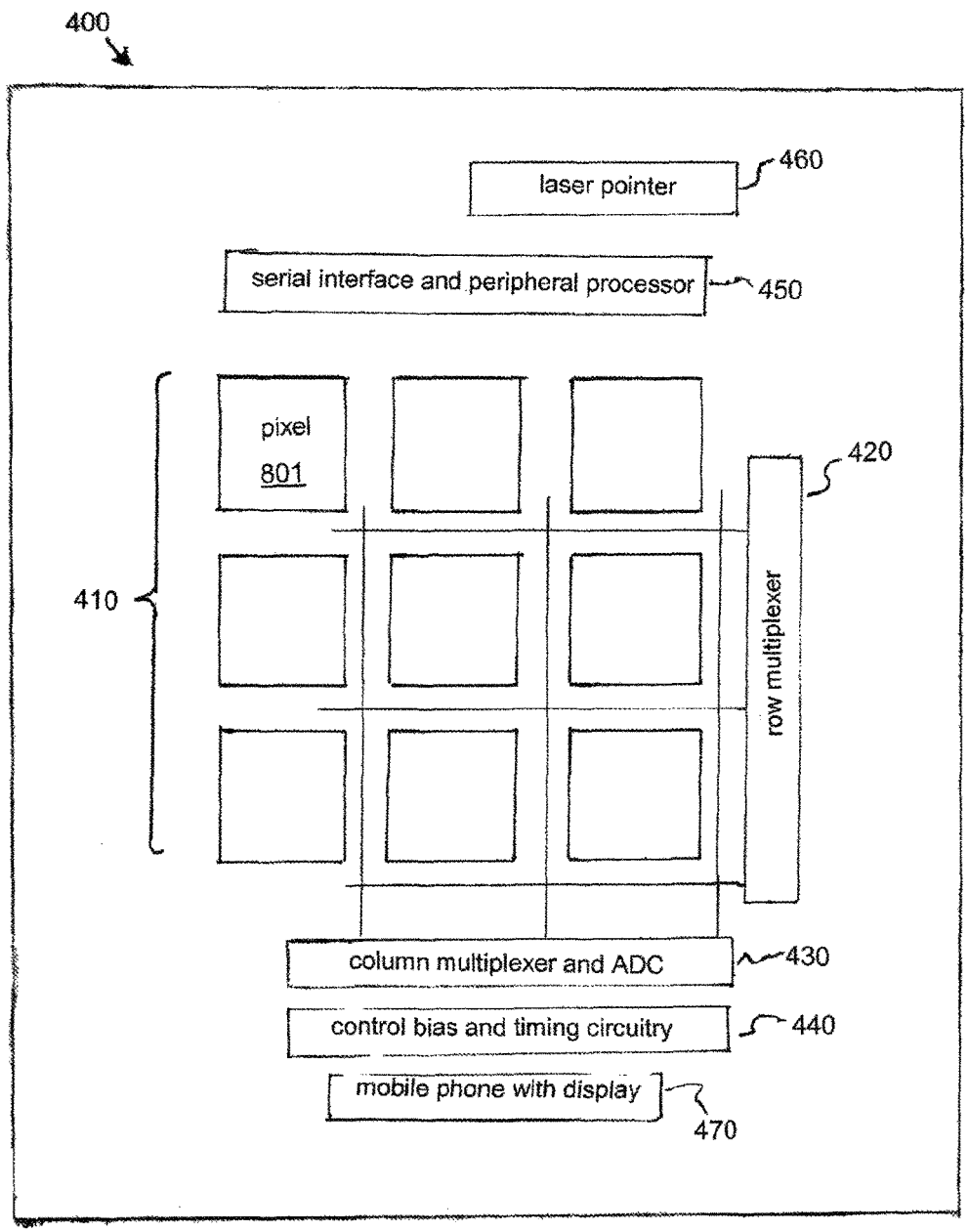
FIG. 5 depicts a plan view of a remote infrared temperature sensor incorporating the pixel in accordance with the present teachings.

FIG. 5 depicts a plan view of a remotely-sensing thermometer which senses infrared radiation from a remote scene or object. In this embodiment the pixel 801 is adapted to form pixel 600 sensitive to incident infrared radiation. An infrared detector apparatus in accordance with the present teachings is comprised of one or more thermoelectric pixels 600 exposed to an external thermal radiation source. In this embodiment, optics focus heat radiated from a remote scene or object onto the pixel micro-platform 626. The resulting absorption of heat into the micro-platform 626 and absorbers thereon creates a temperature differential with respect to the off-platform 608 temperature reference. The resulting temperature differential creates a Seebeck voltage proportional to infrared power absorbed into the micro-platform 626.

The thermometer 400 of FIG. 5 depicts an array of pixels 410 adapted with an enhanced infrared absorption feature. In this embodiment the micro-platform is exposed to infrared radiation from a remote scene or source of heat. Radiation emitted from a remote scene at room temperature has a maximum radiance at 10 micrometer wavelength. Emitted radiance increases with temperature of the scene or object and peaks at shorter wavelengths with increasing temperature. For example, emitted radiance peaks at near 1 micrometer wavelength from a source scene at 3000 degrees Centigrade. When optics focus this scene or object onto individual pixels 600 of the remote-reading thermometer apparatus, the micro-platform 626 is heated by a temperature increment proportional approximately to the scene or object absolute temperature T to the fourth power. The pixel 600 responds to absorbed incident radiation from a remote scene and provides a voltage into signal conditioning circuitry. In a typical remote-reading thermometer embodiment, readout signals origination from a scene radiation are monitored at two or more different infrared wavelengths and processed using Planck's law of black-body radiation to determine the temperature of the source scene or object.

The Seebeck voltage signal is read-out from the array 400 by row multiplexer 420 and column multiplexer and ADC 430 to provide addressing of individual pixels 801. Peripheral circuits in the remote-reading thermometer include control bias and timing circuitry 440, serial interface and peripheral processor 450 and a laser pointer 460. The laser pointer provides an illuminated spot reflected from the remote scene either of visible or infrared light. The laser pointer provides a convenient spatial location reference corresponding to the radiant area of interest.

A figure of merit for a remote-reading temperature sensor is the minimum detectable temperature differential (also known as the noise-equivalent temperature-differential NETD). This differential temperature is desirably reduced by increasing the effective area of the micro-platform 626 in the detection pixel 801. This is accomplished in embodiments by connecting a multiplicity of pixels 600 in the illustrative series connection such s FIG. 6. The pixel embodiment 600 is termed a "super pixel".

Figure 6:
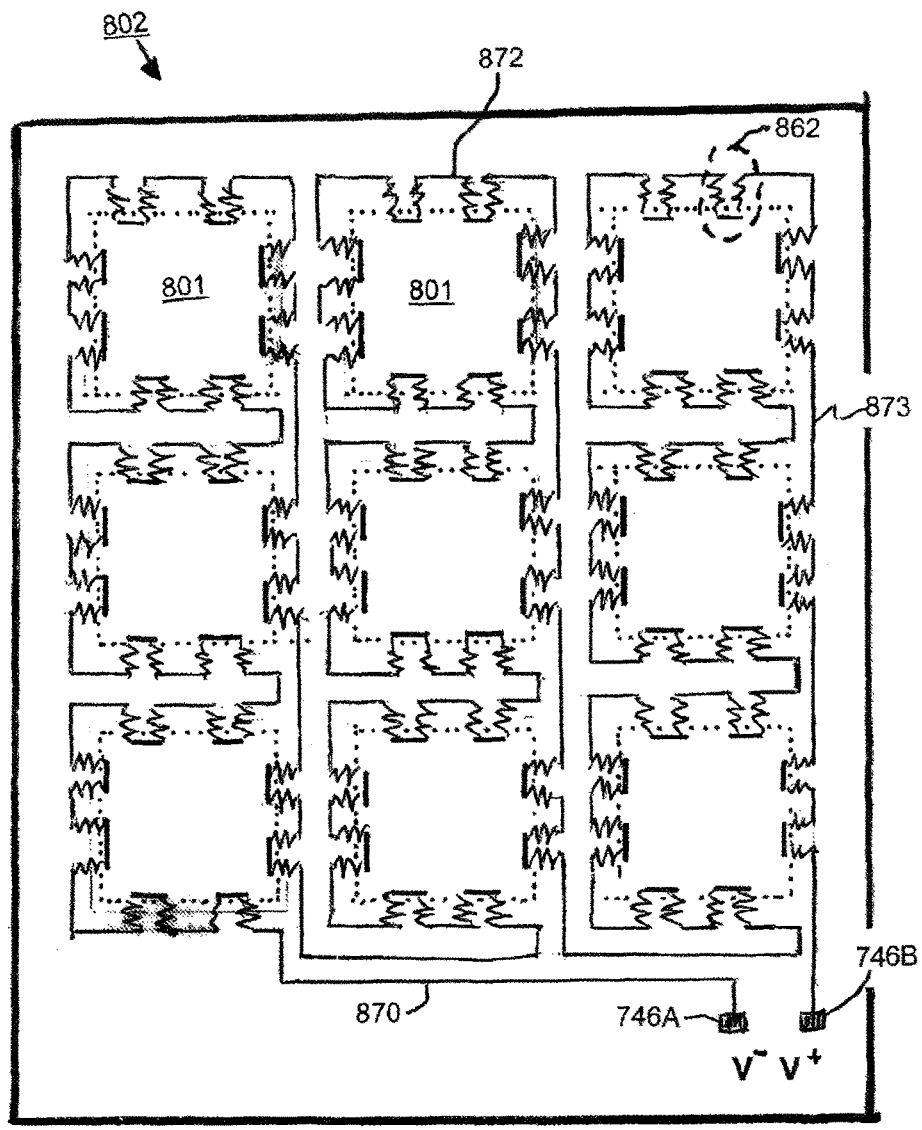
FIG. 6 depicts a plan view of an embodiment comprising an array of pixels with thermoelectric devices configured with a series electrical connection.

FIG. 6 depicts a plan view of an embodiment comprising an array of pixel 801 adapted as pixel 600 with multiple pixels connected electrically. Series-connected intrapixel interconnecting wires 870 and 872 are further connected with interpixel interconnecting wires 873 onto the array output voltage terminals 746A and 746B. In this embodiment thermoelectric Seebeck voltage from individual pixels is multiplied by the number of series-connected pixels to provide a larger Seebeck voltage across output terminals 746A and 746B. Interconnects and output terminals are typically formed of patterned aluminum using standard production processes.

This embodiment provides an infrared sensor calibrated to determine the temperature of a scene or object remotely in accordance with the present teachings.

EXAMPLE 4

Thermoelectric Energy Harvester

Figure 7A:
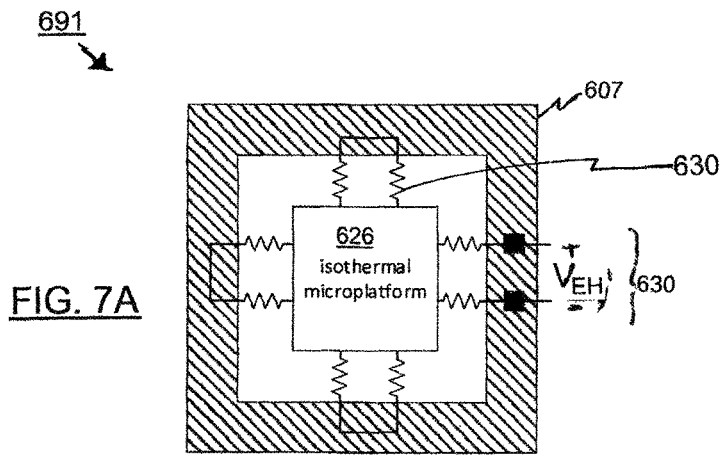
FIGS. 7A and 7B depict a plan view of the pixel and a cross-section view the pixel adapted to function as an energy harvester with two isothermal surfaces in accordance with the present teachings.
Figure 7B:
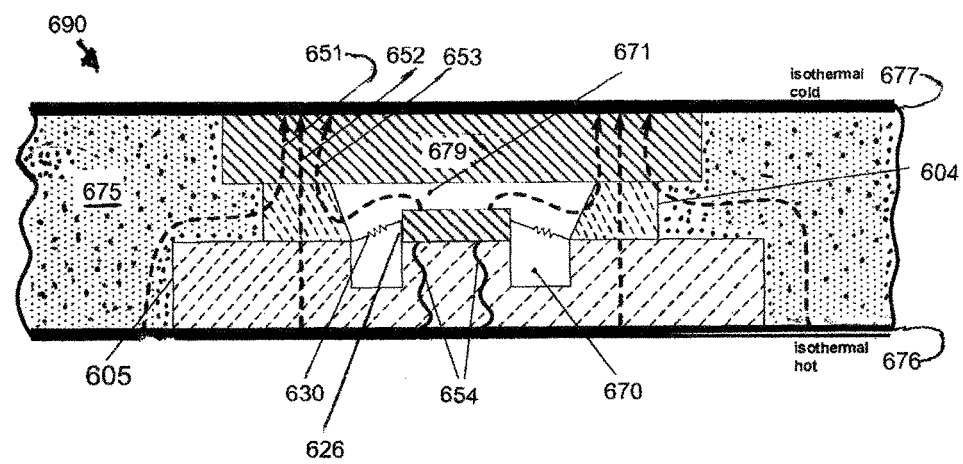

In embodiments, the pixel 801 is adapted form a pixel 690 and 691 to provide an thermoelectric energy harvester function in accordance with the present teachings. FIGS. 7A and 7B depict a plan view of the adapted pixel 690 and a cross-section view the adapted pixel 691 with two isothermal surfaces in accordance with the present teachings. The harvester pixel 690 is disposed within a thermal path between two isothermal surfaces 676 and 677. In this embodiment the pixel is operated in the Seebeck mode. FIG. 7A depicts the pixel with its thermoelectric elements 630 connected to provide voltage $V_{EH}$ at electrical output terminals 630. The harvester provides structures which maintain the isothermal platform 626 and the off-platform area 607 at different temperatures thereby providing the temperature differential necessary for transduction into a voltage at terminals 630.

The energy harvesting pixel 690 is comprised of structural spacers 605 and 679. Note that the cross-section view of the generic pixel 801 disposed therein is inverted in FIG. 7B compared with FIGS. 2A,2B,2C and 2D. The pixel 801 with its micro-platform 626, nanowires 630, and substrate 604 is adapted into the harvester pixel 690.

The operation of the pixel 690 can be understood by describing the three primary thermal conduction paths between the isothermal surfaces 676 and 677. Thermal path 653 links the two isothermal surfaces 676 and 677 thermally with the pixel thermoelectric structure 801 disposed within the pixel 690. More specifically, the thermal path 653 provides a high thermal conductivity path through spacer 679 and the metal vias 654 of spacer 605 providing a maximum temperature differential across the nanowires 630. This thermal structure provides a maximum temperature differential across the nanowires 630 which have a relatively small thermal conductivity. Thermal paths 651 and 652 are parasitic paths that degrade the performance of the energy harvester. The net thermal conductivity of these paths linking the isothermal surfaces 676 and 677 is designed to be as small as possible. Thermal path 652 links the two surfaces through the harvester substrate 605 of low thermal conductance which is disposed thermally in series with the high thermal conductance spacer 679 and substrate 604. Thermal path 651 includes the low thermal conductance spacers 679 and the fill foam 675. Thermal path 652 links the two surfaces through the low thermal conductance spacers 605 and 679. Cavity 670 formed in spacer 605 reduces the parasitic thermal loss through the parasitic path 652.

In embodiments the isothermal surfaces 676 and 677 are comprised of sheet metals such as aluminum and copper. The spacer 679 is a bulk material of high thermal conductivity such as aluminum or high-thermal conductivity ceramic. Spacer 605 is a bulk material of low thermal conductivity such as FR4, Kapton™, and selected polymers. The low thermal conductivity fill 675 is comprised of a material such as polyurethane foam, EVA and an aerogel. In embodiments materials for the fill foam 675 and spacer 605 are preferably selected from materials with a bulk thermal conductivity less than 1 W/mK.

Figure 8A:
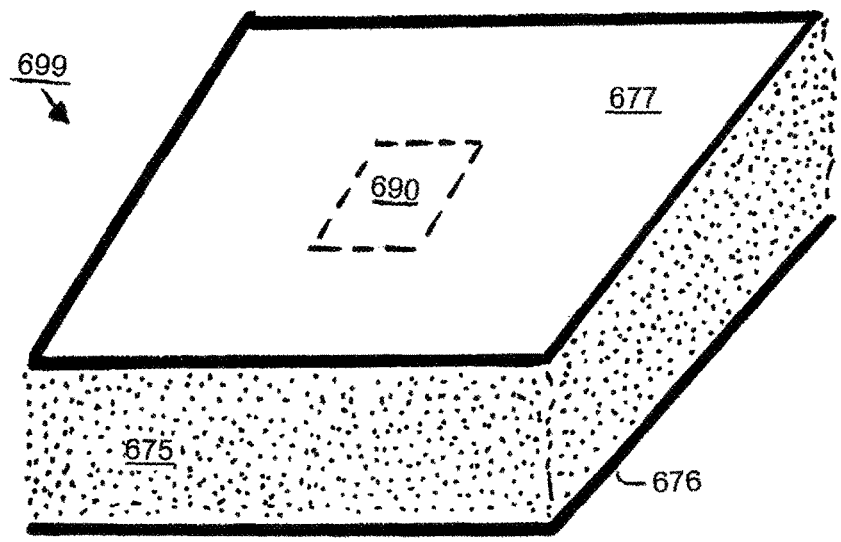
FIGS. 8A and 8B depict cross-section and oblique views of an energy harvester incorporating a pixel in accordance with the present teachings
Figure 8B:
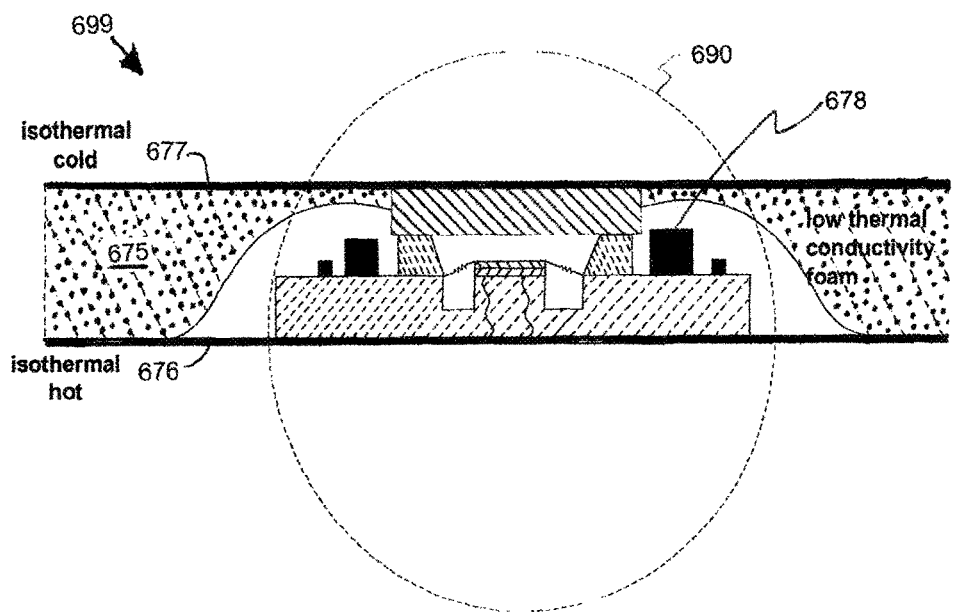

FIGS. 8A and 8B depict cross-section and oblique views of an energy harvester incorporating the pixel 801 structured into pixel 690 of FIG. 7B in accordance with the present teachings. The oblique view of FIG. 8A depicts an embodiment of the energy harvester 699 comprised of the pixel 690 disposed within. The isothermal surfaces 677 and 676 are maintained at a temperature differential. A low thermal conductivity fill material 675 is disposed within the harvester 699.

FIG. 8B depicts a cross-section of the harvester 699 with harvesting pixel 690 disposed therein. Electrical components and circuits 678 can be assembled onto and into the spacer 605 which is typically a type of printed circuit board. The electronic assembly 678 comprises such components as a supercapacitor, DC-to-DC converter, signaling sensor and various integrated circuits.

EXAMPLE 5

RFID Transponder Radio

Figure 9:
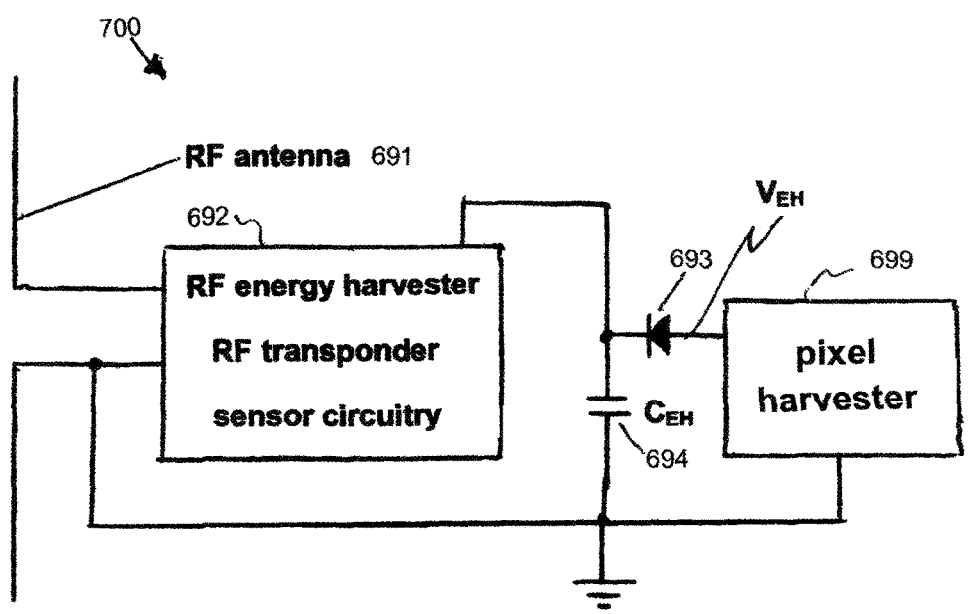
FIG. 9 depicts the function of an radio incorporating a thermoelectric pixel in accordance with the present teachings.

FIG. 9 depicts the function of a radio 700 incorporating the pixel 801 adapted in accordance with the present teachings. The pixel 801 adapted to function as an energy harvester 699 is incorporated with an antenna 691 and ancillary components to provide an RFID transponder 700. The transponder in this embodiment is comprised of the pixel harvester 699, an RF antenna 691, selected load circuits 692, a capacitor 694 and a limiting diode 693. The pixel harvester 700 operates in the Seebeck mode to provide power for the selected circuits 692. Harvested electric energy is stored in the capacitor 694 via the diode 693. Diode 693 permits retention of charge on the capacitor 694 in the event that the Seebeck voltage $V_{EH}$ drops below a threshold level.

Figure 10:
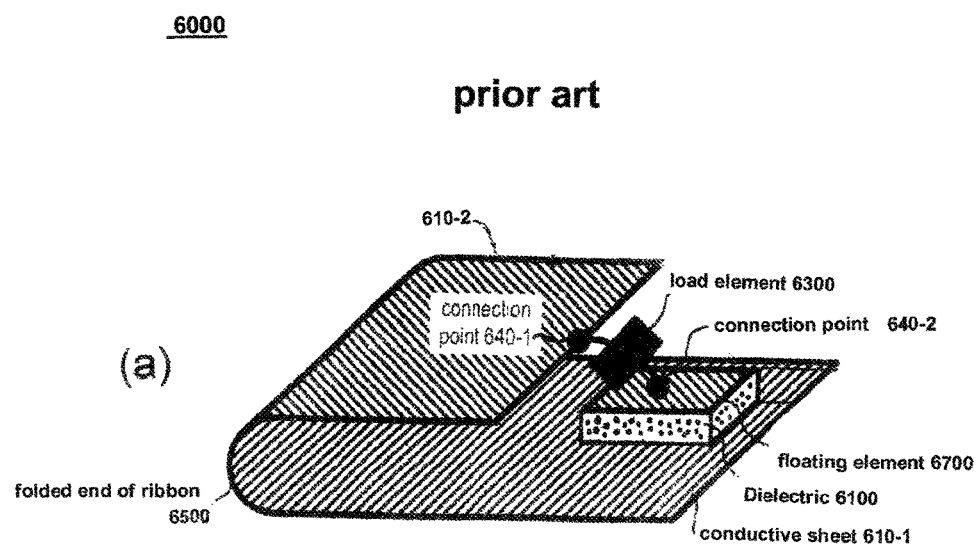
FIG. 10 depicts a prior art single-cavity antenna as used in conjunction with the RFID transponder of FIG. 9

FIG. 10 depicts a prior art single-cavity antenna as used in conjunction with the RFID radio of FIG. 9. This single-cavity antenna is disclosed in U.S. Pat. No. 8,477,079 which is incorporated herein by reference. FIG. 10 depicts a sheet or ribbon antenna 6000 in accordance with the prior art which relates to embodiments of the present invention. Ribbon antenna 6000 is a single-cavity with a conductive lower sheet 610-1 and conductive upper sheet 610-2 separated by a cavity volume. The folded end 6500 provides a low impedance RF-electrical connection between the two conductive sheets. The upper and lower ribbons with the electrical end connection form an electromagnetic cavity that is tuned to an appropriate frequency generally between 300 MHz and 30 GHz. This single-cavity antenna is driven from a circuit assembly load element 630 which provides a drive signal $V_{RF}$ between connection points 640-1 and 640-2. This antenna is comprised of a floating element 6700 which is positioned on a dielectric film 6100 over conductive sheet 610-1. Dielectric 6100 is made of a material whose dielectric properties provide additional parameters that can be varied for the purpose of achieving a desired impedance in addition to providing structural support for element 6700 of the antenna. Typically a dielectric is provided between the upper and lower sheets or ribbons to increase structural integrity and to tune the antenna.

Figure 11:
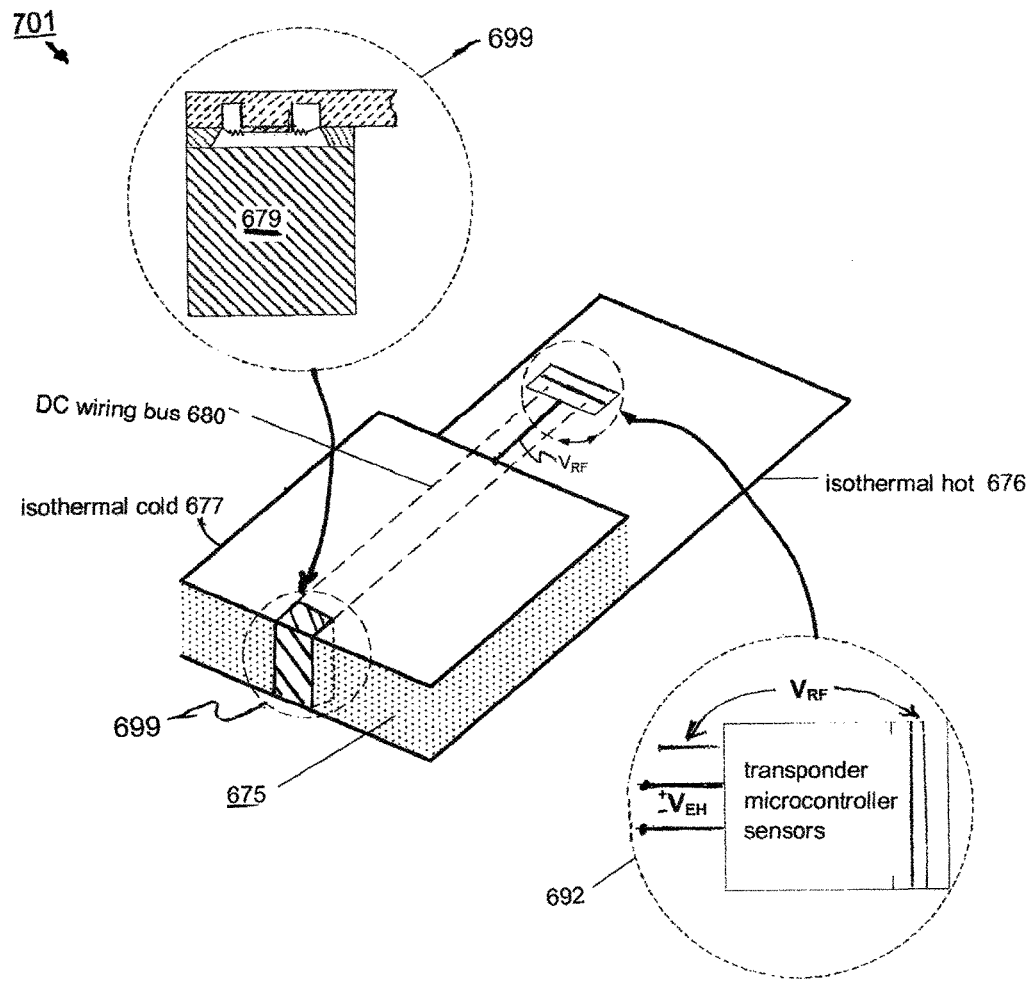
FIG. 11 depicts a radio of FIG. 9 structured with a single-cavity antenna of FIG. 10 in accordance with the present teachings.

The single-cavity antenna 6000 of FIG. 10 is adapted using the energy harvesting pixel 699 to provide the RFID transponder 701 of FIG. 11. In order to provide the RFID transponder of FIG. 11, the folded end of ribbon 6500 is replaced by thermoelectric pixel 699. The low RF impedance of the folded end of ribbon 6500 between the two isothermal surfaces of pixel 699 is replaced by the low impedance that the pixel 699 provides between its two isothermal surfaces 676 and 677 provides the equivalent low RF impedance. In embodiments of radio 701 an electrical capacitor is added in parallel with the thermoelectric device of the harvester pixel 699 to further reduce its RF impedance. The spacer 679 is structured to provide the appropriate spacing between conductors 676 and 677. The load element 6300 and floating element 6700 are replaced by the circuit 692 to provide a radio 701. The fill foam structured into the antenna cavity is typically similar to the fill foam 675 in the radio 701. The pixel 699 is typically structured to include the energy storage capacitor 694 and the diode 693. DC power from the pixel 699 is supplied via wiring bus 680 to the circuits 692 comprising RF, digital and analog electrical circuits.

The RFID radio 700 of FIG. 9 can also be provided by disposing the thermoelectric pixel 699 within a double-cavity antenna structure in accordance with the present teachings. Prior art double-cavity antennas are disclosed in U.S. Pat. Nos. 8,384,599 and 8,581,793. Other closely related double- and multiple-cavity antennas are disclosed in U.S. Pat. Nos. 8,284,104, 9,160,070 and 9,160,079. These five U.S. Patents are all incorporated herein by reference.

Figure 12:
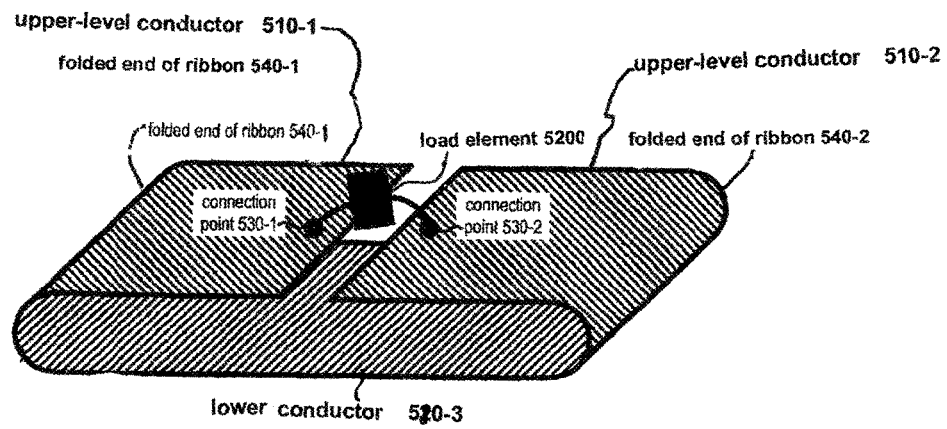
FIG. 12 depicts a prior art double-cavity antenna as used in conjunction with the RFID radio of FIG. 9.

FIG. 12 depicts the double-cavity ribbon antenna in accordance with prior art which relates to embodiments of the present invention. Ribbon antenna 5000 comprises a double-cavity with upper conductors 510-1 and 510-2 and a lower conductor 510-3. The two upper ribbon conductors 510-1 and 510-2 are electrically-connected with a load element 5200 disposed between them and above a middle part of lower ribbon conductor 510-3. The upper conductors 510-1 and 510-2 are separated from the lower conductor 510-3 by a cavity volume. The folded ends 510-1 and 510-2 provide separate low impedance RF-electrical connections between the upper conductors and the lower conductor 510-3. Typically a dielectric fill is provided between the upper and lower conductors to increase structural integrity and to tune the antenna. The double-cavity antenna 5000 is driven from a circuit load element 5200 which provides a drive signal $V_{RF}$ between connection points 530-1 and 530-2. In embodiments of the present invention a thermoelectric adapted pixel structure 699 provides the RF-conductive electrical path at the end of the ribbon instead of the ribbon connections 540-1 and 540-2.

Figure 13:
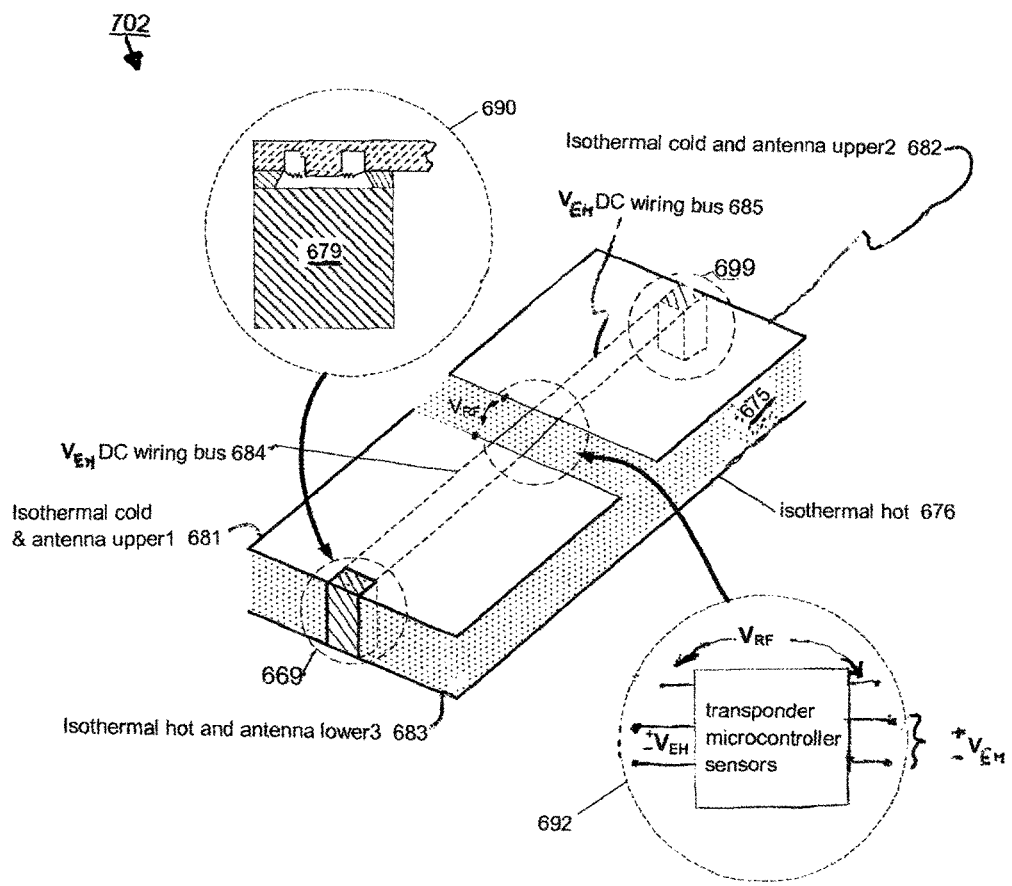
FIG. 13 depicts a radio of FIG. 9 structured with a double-cavity antenna of FIG. 12 in accordance with the present teachings.

In a further embodiment, a multi-cavity antenna 5000 of FIG. 12 is adapted using the energy harvesting pixel 699 to provide the RFID transponder 702 of FIG. 13. In order to provide the RFID radio function of FIG. 11, both folded ribbon ends are replaced by separate thermoelectric pixels 699. The low RF impedance between the two isothermal surfaces of pixel 699 provides the equivalent low RF-impedance of the folded end RF connections 540-1 and 540-1 of ribbon conductors 510-1 and 510-2. In embodiments of transponder 702, an electrical capacitor is added in parallel with the thermoelectric device of the harvester pixel 699 to further reduce its RF-impedance. The load element 5200 across connection points 530-1 and 530-2 is replaced by circuit 692. DC power from the pixel 699 is supplied via DC wiring bus 684 to the circuits 692 comprising RF, digital and analog electrical circuits. The spacer 679 of the pixel 699 is structured to provide the appropriate spacing between conductors 676 and 677

The fill foam structured into the antenna cavity is typically similar to the fill foam 675 in the radio 701. The pixel 699 is typically structured to include the energy storage capacitor 694 and the diode 693.

In applications of the RFID transponders 701 and 702 present invention an upper ribbon conductor is maintained at a temperature different from the lower conductor thereby providing a thermal energy source for the thermoelectric structure.

The load circuit 692 in embodiments is comprised of a passive RFID transponder IC which communicates with a remote interrogator by modulating back-scattered radiation originating from a remote interrogator or beacon.

The load circuit 692 in embodiments is comprised of a semi-passive or active RFID transponder IC. In embodiments the transponder may be comprised of ancillary power sources including such as one or more of a battery, solar cell, piezoelectric generator, fuel cell, or electromechanical power source. In embodiments the load circuit 692 is comprised of one or more of one or more transducers including but not limited to a sensor for temperature, humidity, sweat, pressure, strain, acceleration, fluid flow, velocity, nuclear radiation, gravitational force, light intensity, infrared radiation, nuclear radiation, chemical species and electromagnetic radiation of various wavelengths. The RFID transponder in embodiments comprises a passive, semi-passive or active transponder and integral antenna providing wireless communication with a remote interrogator or wireless network. The RFID transponder in embodiments is comprised of a radio. The remote interrogator in embodiments includes devices such as a mobile telephone.

EXAMPLE 6

Wearable Biomedical Sensor

Figure 14:
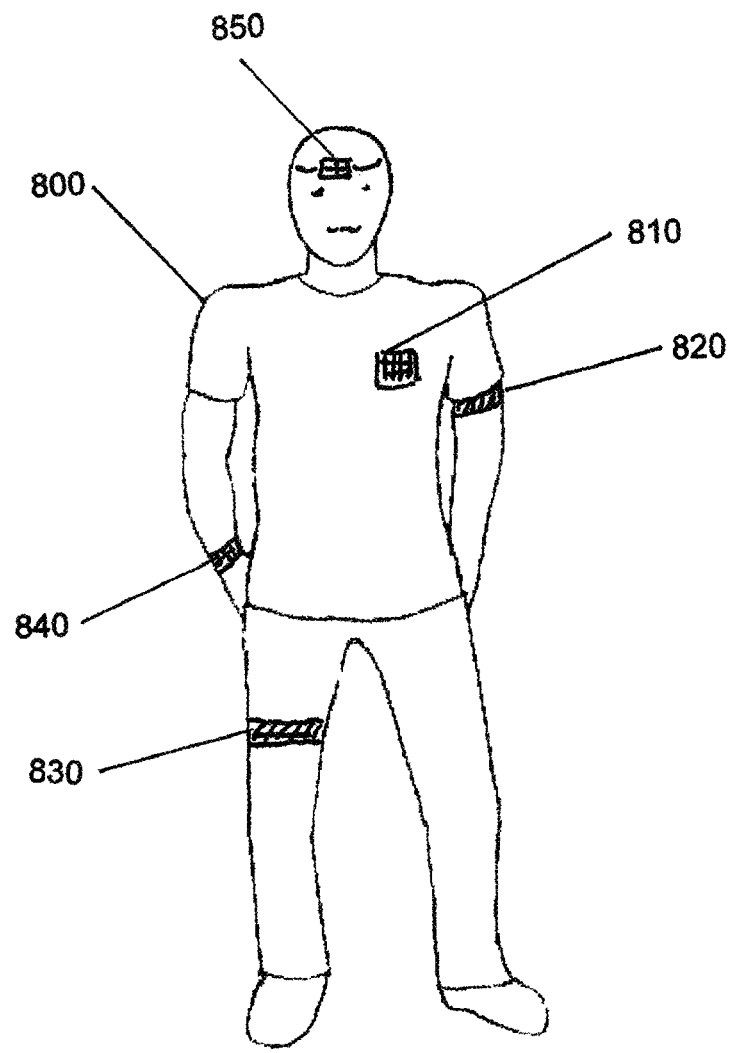
FIG. 14 depicts the radio of FIG. 9 in a wireless biomedical embodiment disposed at multiple positioning sites on a human subject.

FIG. 14 depicts the RFID transponder of FIG. 9 in a wireless biomedical embodiment 800 disposed at multiple positioning sites on a human subject. In this embodiment the thermoelectric pixel 699 is adapted into a transponder configuration for the purpose of monitoring one or more of body functions such as physical movement, body temperature, and heart beat rate.

FIG. 14 depicts the RFID transponder disposed in locations 810, 820, 830, 840 and 850 on a human subject. In embodiments the sensor comprises a passive, semi-passive or active transponder and integral antenna providing wireless communication with a remote interrogator or wireless network. The remote interrogator in embodiments includes devices such as a mobile telephone.

It is understood that although the disclosure teaches many examples of embodiments in accordance with the present teachings, many additional variations of the invention can easily be devised by those skilled in the art after reading this disclosure. As a consequence, the scope of the present invention is to be determined by the following claims.

What is claimed:

1. An apparatus comprising a thermoelectric pixel, wherein the pixel comprises:
   a micro-platform comprising a device layer;
   an off-platform region, the off-platform region surrounding the micro-platform;
   a support layer disposed on the micro-platform and a portion of the off-platform region, wherein the support layer comprises a film that imparts a tensile stress across the micro-platform;
   a plurality of thermoelectric devices, wherein a first junction of each thermoelectric device is disposed in or on the device layer and a second junction of each thermoelectric device is disposed in or on the off-platform region, and;
   a plurality of nanowires, wherein the nanowires electrically couple the first junctions to respective second junctions.

2. The apparatus of claim 1 wherein the nanowires have at least one physical adaptation that enhances at least one of scattering of phonons or resonance of phonons.

3. The apparatus of claim 1 wherein the stress-enhancing film comprises at least one material selected from the group consisting of silicon nitride, silicon oxynitride, gallium nitride, and silicon carbide.

4. The apparatus of claim 2 wherein the at least one physical adaptation is selected from the group consisting of a plurality of micro-cavities and particulates each with a dimension less than 500 nanometers.

5. The apparatus of claim 1 wherein one or more thermoelectric devices are operated in the Seebeck mode.

6. The apparatus of claim 1 wherein one or more thermoelectric devices are operated in the Peltier mode.

7. The apparatus of claim 1 wherein the nanowires are comprised of one or more materials selected from the group consisting of silicon, silicon-germanium, bismuth telluride, lead telluride, germanium, indium gallium arsenide, bismuth, silver, nanotubes comprising alloys of the group materials, nanotubes comprising composites of the group materials, and nanotubes comprising particles of the group materials.

8. The apparatus of claim 1 wherein the micro-platform comprises infrared absorbers, wherein the infrared absorbers comprise one or more materials selected from the group consisting of carbon nanotubes, nano-sized particulates, silicon grass, nanotubes comprising non-carbon material, lithographically-patterned structures and plasmonic metamaterial.

9. The apparatus of claim 1 further comprising a multiplicity of micro-platforms disposed in an array format.

10. The apparatus of claim 1 further comprising a radio and an RF antenna operational at one or more frequency bands.

11. The apparatus of claim 1 further comprising one or more of:
   (i) an autonomous sensor; and
   (ii) one of a passive, semi-passive or active transponder and a n integral antenna.

12. The apparatus of claim 1 further comprising an integrated circuit disposed in or on the microplatform.

13. The apparatus of claim 1 further comprising optics physically adapted for imaging heat onto the micro-platform.

14. The apparatus of claim 1 further comprising a biomedical sensor that monitors one or more body functions.

15. The apparatus of claim 1 further comprising two external isothermal surfaces each independently thermally-coupled to the microplatform and surrounding off-platform region, wherein a voltage is generated responsive to a differential temperature between the micro-platform and the off-platform region.

16. The apparatus of claim 1 further comprising an integrated circuit and associated circuit components disposed in or on a printed circuit board.

17. The apparatus of claim 1 further comprising an energy source selected from the group consisting of a battery, solar cell, piezoelectric generator, fuel cell, and electromechanical power source.

18. The apparatus of claim 1 further comprising an energy storage device, wherein the energy storage device is electrically connected to the thermoelectric devices.

19. The apparatus of claim 1 further comprising at least one sensor selected from the group consisting of temperature sensor, humidity sensor, sweat sensor, pressure sensor, strain sensor, acceleration sensor, fluid flow sensor, velocity sensor, nuclear radiation sensor, gravitational force sensor, light sensor, infrared radiation sensor, chemical sensor and electromagnetic radiation sensor.

20. The apparatus of claim 15 further comprising:
a RF transponder radio, wherein the RF transponder radio includes a load circuit, first electrical power connections to the thermoelectric pixel for receiving power therefrom, and second electrical RF connections to the two external isothermal surfaces, the two external isothermal surfaces functioning:
(a) for energy harvesting via the thermal couplings to the microplatform and off-platform region; and
(b) as a RF antenna for the RF transponder radio.

21. The apparatus of claim 20 wherein the RF antenna is selected from the group consisting of a single-cavity antenna and a double cavity antenna.

22. The apparatus of claim 20 wherein the load circuit comprises a wearable biomedical sensor having at least one surface for thermally coupling to an animal.

* * * * *